(12) United States Patent
Matsumura

(10) Patent No.: US 7,736,459 B2
(45) Date of Patent: Jun. 15, 2010

(54) COMPRESSION BONDING DEVICE AND A MOUNTING METHOD

(75) Inventor: Takashi Matsumura, Kawachi-gun (JP)

(73) Assignees: Sony Corporation, Tokyo (JP); Sony Chemical & Information Device Corporation, Tokyo (JP)

( * ) Notice: Subject to any disclaimer, the term of this patent is extended or adjusted under 35 U.S.C. 154(b) by 0 days.

(21) Appl. No.: 12/216,873

(22) Filed: Jul. 11, 2008

(65) Prior Publication Data

US 2009/0032570 A1 Feb. 5, 2009

Related U.S. Application Data

(63) Continuation of application No. PCT/JP2007/050307, filed on Jan. 12, 2007.

(30) Foreign Application Priority Data

Jan. 13, 2006 (JP) .............................. 2006-006517

(51) Int. Cl.
- B29C 65/02 (2006.01)
- B29C 65/48 (2006.01)
- B32B 37/06 (2006.01)
- B32B 37/10 (2006.01)
- B32B 37/26 (2006.01)

(52) U.S. Cl. .................. 156/289; 156/306.9; 156/307.1

(58) Field of Classification Search ................. 155/289, 155/291, 306.6, 306.9, 307.1, 307.7, 381, 155/537, 580, 583.1, 583.3

See application file for complete search history.

(56) References Cited

U.S. PATENT DOCUMENTS

| | | | | |
|---|---|---|---|---|
| 5,972,140 A | * | 10/1999 | Hass et al. | 156/89.11 |
| 2004/0238115 A1 | * | 12/2004 | Matsuno et al. | 156/297 |
| 2006/0113356 A1 | | 6/2006 | Matsumura et al. | |

FOREIGN PATENT DOCUMENTS

| | | |
|---|---|---|
| EP | 1 646 081 A1 | 4/2006 |
| JP | A-9-8185 | 1/1997 |
| JP | A-11-354588 | 12/1999 |
| JP | A-2002-359264 | 12/2002 |
| JP | A-2003-86635 | 3/2003 |
| JP | A-2005-32952 | 2/2005 |
| WO | WO 2005/006430 A1 | 1/2005 |
| WO | WO 2007/080956 A1 | 7/2007 |

* cited by examiner

Primary Examiner—Philip C Tucker
Assistant Examiner—Sing P Chan
(74) Attorney, Agent, or Firm—Oliff & Berridge, PLC

(57) ABSTRACT

A compression bonding device has a dam member so that when a pressing head is pressed against an object to be pressed, the bonding part is surrounded by the dam member. Thus, even if the surface of the bonding part bulges by pressing, the bulging part is stopped by the dam member and the surface of the bonding part does not horizontally extend. As a result of the absence of horizontal extension of the bonding part, electric components of the object to be pressed are not subjected to a force that horizontally moves the electric components and the electric components are vertically pressed downward and connected to the terminals of the substrate. Thus, an electric device having high connection reliability is obtained.

6 Claims, 13 Drawing Sheets

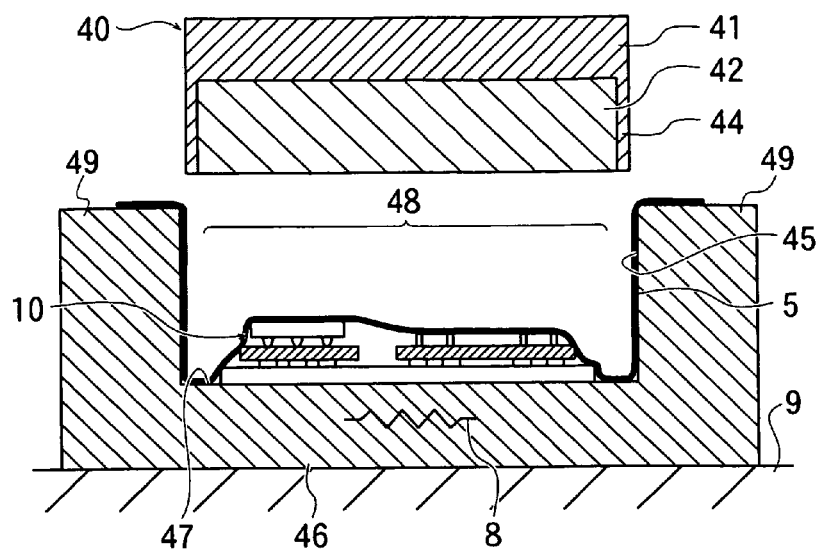
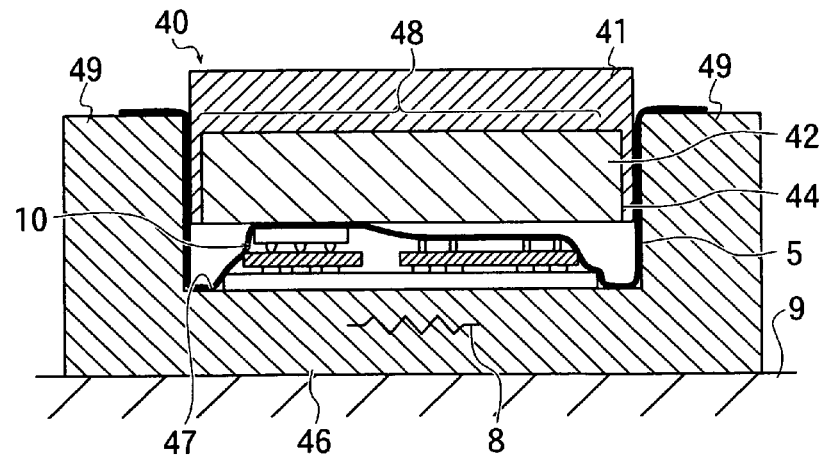
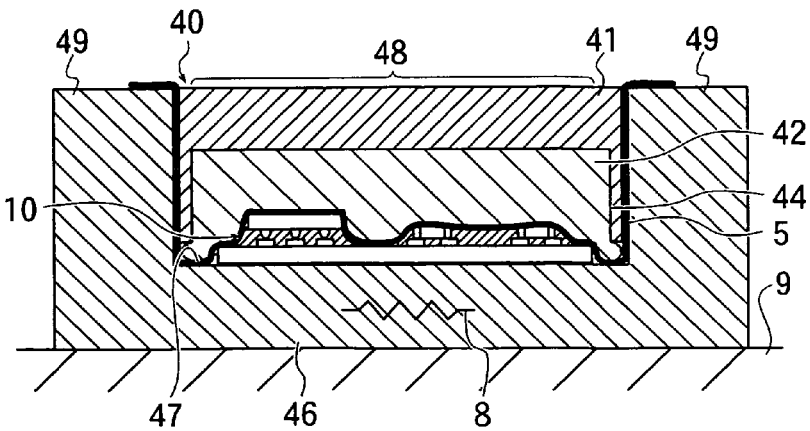
Fig. 8 (a)
Fig. 8 (b)
Fig. 8 (c)

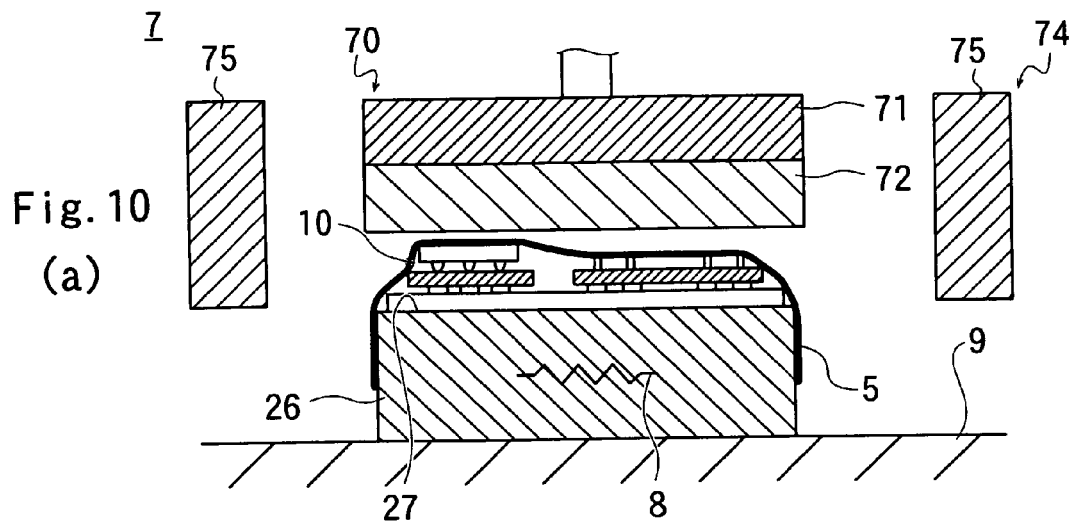
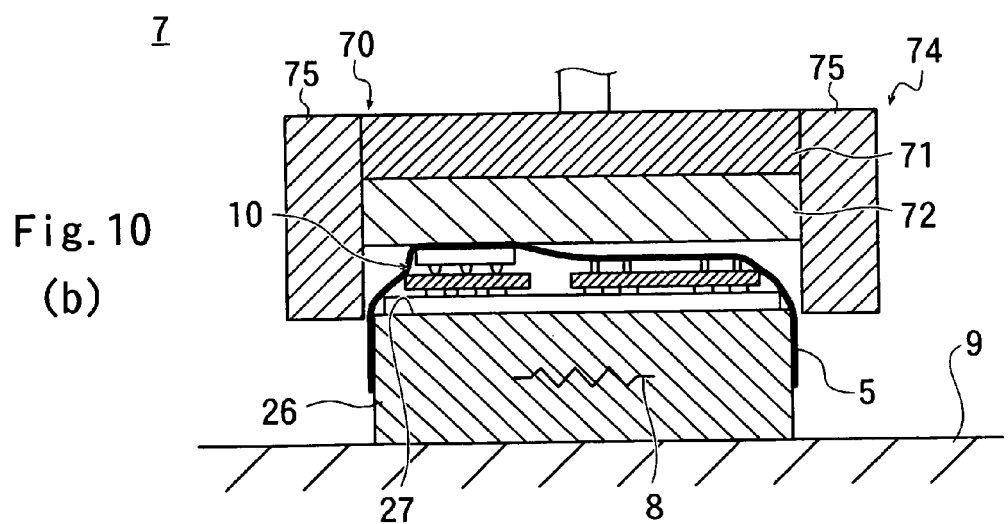
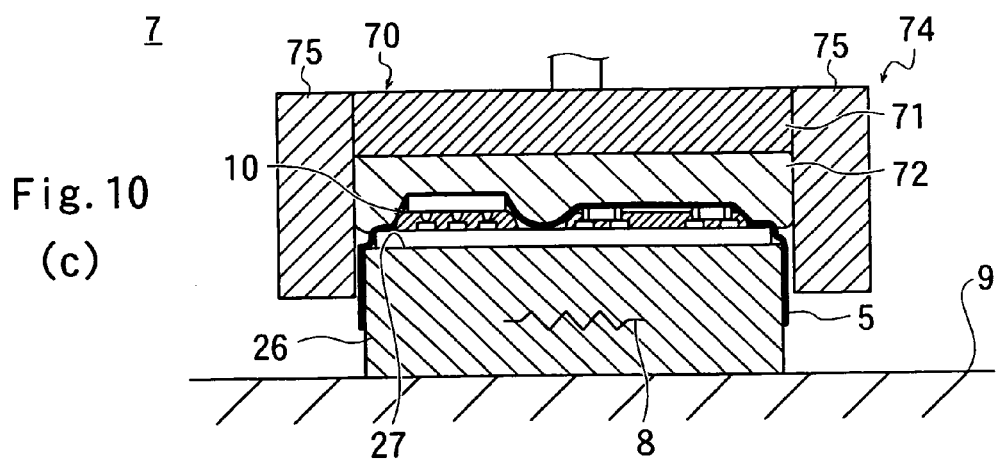

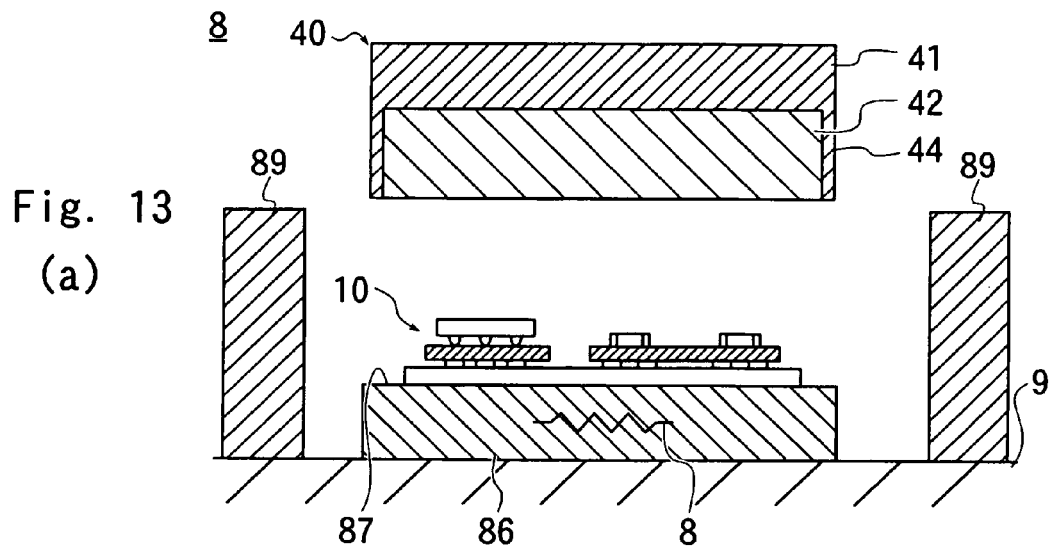
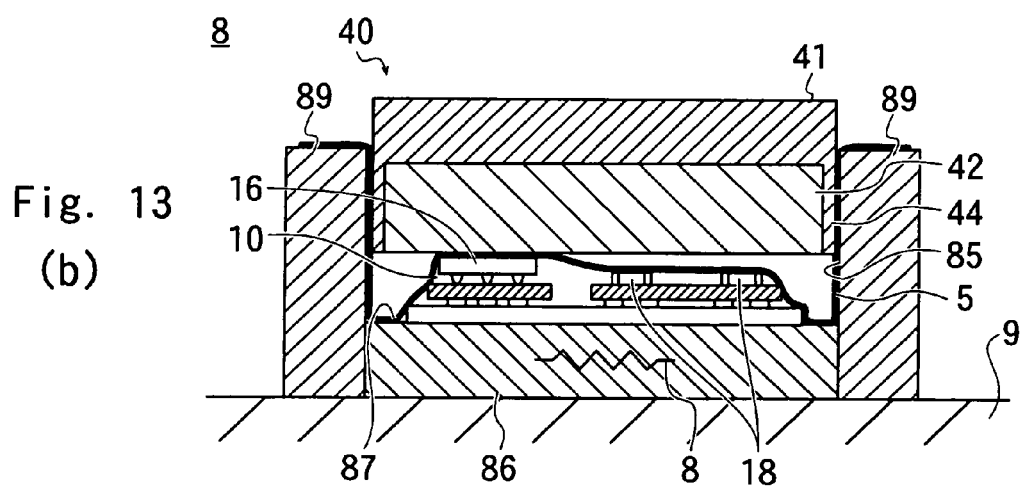
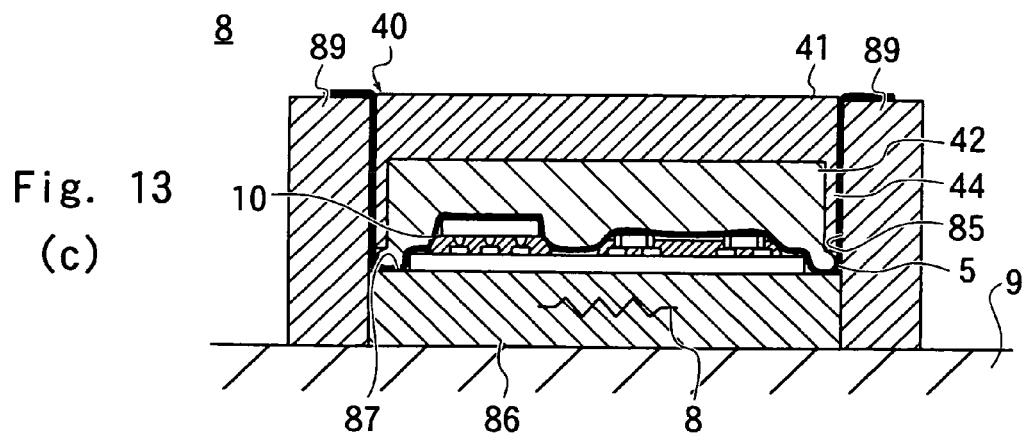

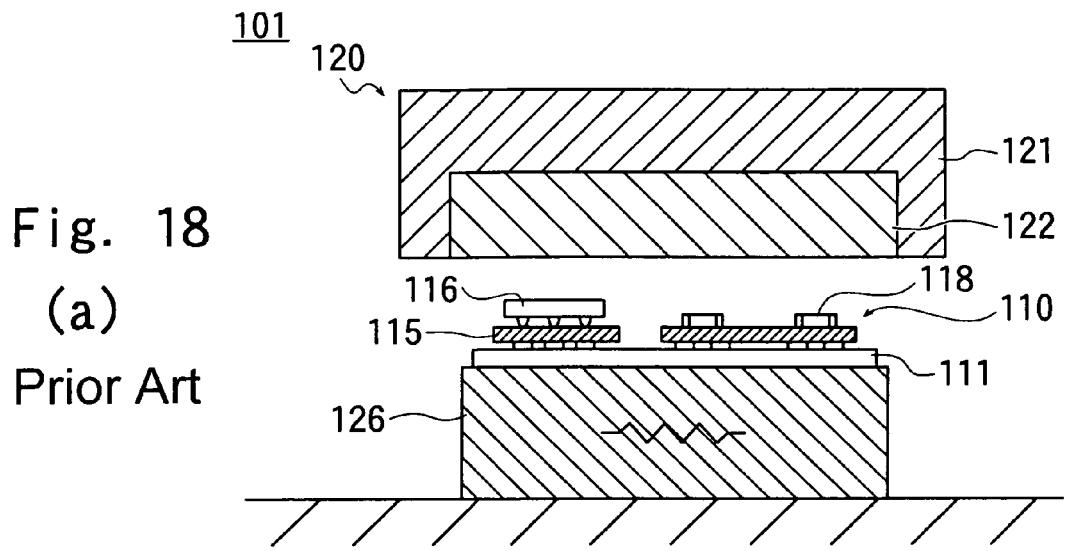
Fig. 18 (a) Prior Art
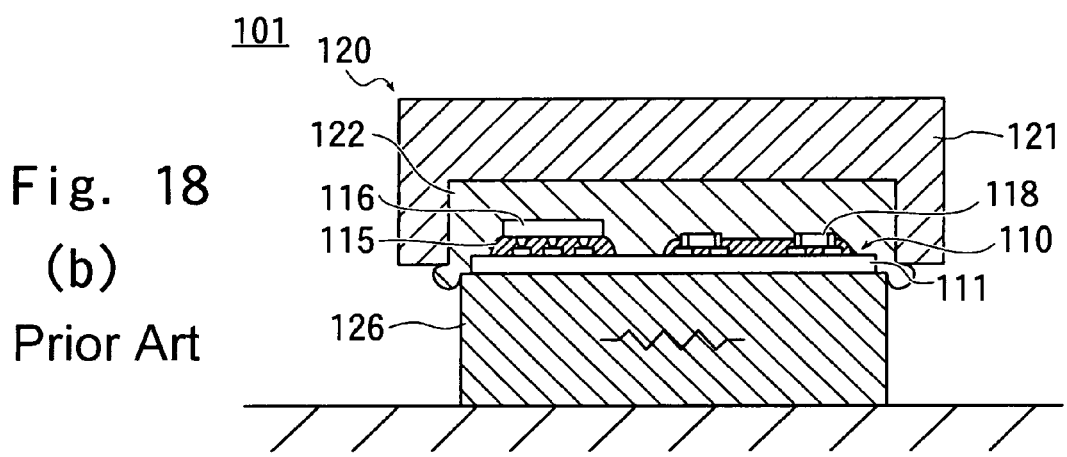
Fig. 18 (b) Prior Art
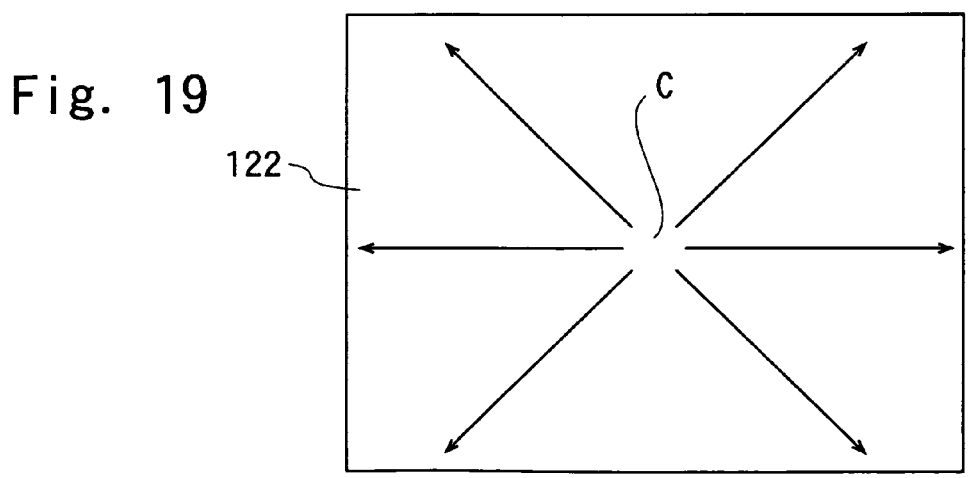
Fig. 19

COMPRESSION BONDING DEVICE AND A MOUNTING METHOD

This is a Continuation of International Application No. PCT/JP2007/050307 filed Jan. 12, 2007, which claims priority to Japan Patent Application No. 2006-006517, filed on Jan. 13, 2006. The entire disclosures of the prior applications are hereby incorporated by reference herein in their entireties.

BACKGROUND

The present invention generally relates to a compression bonding device for packaging electric components on a substrate and packaging processes therefor.

Conventionally, packaging processes for connecting electric components such as semiconductor elements to a substrate have used a compression bonding device by which the electric components are pressed against the substrate with a pressing head under heat.

Reference numeral 101 in FIG. 18(a) represents a conventional compression bonding device. The compression bonding device 101 has a pedestal 126 and a pressing head 120.

The pressing head 120 has a pressing rubber fitted into a metal frame, or a pressing rubber bonded to a metal plate with an adhesive or a liquid rubber cast into a metal frame and cured within the metal frame, etc.

In the case of a pressing rubber 122 fitted into a head body 121 made from a metal frame, the surface of the pressing rubber 122 is flush with the surface of the head body 121 or projects below the surface of the head body 121. When the pressing head 120 is pressed against an object to be pressed 110 on the pedestal 126, the surface of the pressing rubber 122 comes into contact with the object to be pressed 110.

The object to be pressed 110 has a substrate 111 and electric components 116, 118 having different thicknesses placed on the substrate 111 so that steps are formed on the substrate 111 due to the thickness differences between the electric components 116 and 118.

The pressing rubber 122 is formed of an elastic material that deforms under pressure. The pressing rubber 122 first comes into contact with the thickest electric component 116. Then, the pressing rubber 122 deforms and successively comes into contact with the electric components 116, 118 in the order of thickness from the thickest electric component 116 to thinnest electric component 118. Finally, all of the electric components 116, 118 are pressed by the pressing rubber 122.

Before the electric components 116, 118 are pressed by the compression bonding device 101, the electric components 116, 118 and the substrate 111 are aligned; and terminals of the electric components 116, 118 are directly above terminals of the substrate 111 with an adhesive 115 inserted therebetween.

The surface of the pedestal 126 is nearly horizontal, and the substrate 111 is horizontally placed on that surface. When the pressing head 120 is vertically moved downward to press the electric components 116, 118, the terminals of the electric components 116, 118 and the terminals of the substrate 111 come into contact with each other, thereby electrically connecting the electric components 116, 118 and the substrate 111 (FIG. 18(b)), because the electric components 116, 118 thrust the adhesive 115 aside and move toward the terminals of the substrate 111. Thus, the conventional compression bonding device 101 can simultaneously connect electric components having different thicknesses to one substrate.

However, if the pressing rubber 122 is depressed when it presses components 116, 118, the pressing rubber 122 has the property of bulging around the depressed part. Therefore, the bulging part of the pressing rubber 122 climbs over the frame of the head body 121 with the result that the surface of the pressing rubber 122 extends horizontally outward (FIG. 18(b)).

FIG. 19 is a plan view showing the manner in which the surface of the pressing rubber 122 extends horizontally outward, i.e., the pressing rubber 122 radially flows around the center C of its planar shape. Due to the greater amount of movement at the periphery of the pressing rubber 122 as compared with the vicinity of the center C, the electric components 116, 118 pressed by the periphery of the pressing rubber 122 horizontally move as the pressing rubber 122 extends, whereby the terminals of the electric components 116, 118 are misaligned from the location directly above the terminals of the substrate 111.

If the electric components 116, 118 are misaligned, the terminals of the electric components 116, 118 fail to come into contact with the terminals of the substrate 111, resulting in the deterioration of a reliable connection between the electric components 116, 118 and the substrate 111. See, Patent Documents No. JP A 2002-359264 and JP A 2005-32952.

SUMMARY OF THE INVENTION

The present invention is made to address the problems described above, and its purpose is to provide a compression bonding device capable of reliably connecting electric components to a substrate.

In order to address the problems described above, according to one aspect of the present invention there is provided a compression bonding device comprising a pedestal, a dam member and a pressing head. The pressing head and the pedestal are movable relative to one another to press an object placed on a mounting face of the pedestal with the pressing head. The pressing head comprises a head body and a pressing rubber which is placed in the head body, and the dam member extends beyond the surface level of the pressing rubber and is placed around the pressing rubber, and wherein the pressing rubber, by deforming, presses the object placed on the pedestal when the pressing head and the pedestal are moved relative to one another.

According to some aspects, the present invention provides the compression bonding device wherein the pedestal is inserted into a space surrounded by the dam member.

According to one aspect, the present invention provides the compression bonding device wherein the dam member is separable from the head body.

According to yet another aspect of the present invention, there is provided a compression bonding device comprising a pedestal and a pressing head. The pressing head and the pedestal are movable relative to one another to press an object to be pressed placed on a mounting face of the pedestal with the pressing head. The pressing head comprises a head body and a pressing rubber which is placed in the head body, and the mounting face is surrounded by a dam member having a surface level that extends beyond the mounting face.

According to another aspect, the present invention provides the compression bonding device wherein the pressing head is inserted into a space surrounded by the dam member.

According to yet another aspect, the present invention provides the compression bonding device wherein the dam member is separable from the pedestal.

According to a further aspect, the present invention provides the compression bonding device wherein a compressively deformable compression member is placed between the pressing rubber and the head body, and at least when the compression member is compressed, the dam member becomes higher than the surface level of the pressing rubber.

According to another aspect of the present invention there is provided a component packaging process comprising placing, on a mounting face of a pedestal, an object including a substrate and a plurality of components having different heights on the substrate and pressing the components with a pressing rubber provided on a pressing head and fixing the components to the substrate. The object is surrounded by a dam member and the lateral flow of the pressing rubber due to deformation of the pressing rubber is stopped by the dam member when the pressing rubber presses the components.

In another aspect, the present invention provides the packaging process comprising placing an anisotropic conductive film between the components and the substrate to bond the components to the substrate, and then pressing the components with the pressing rubber while heating the substrate.

In another aspect, the present invention provides the packaging process comprising placing a protective film that is releasable from the anisotropic conductive film between the pressing rubber and the object to be pressed when the components are pressed.

When the pressing rubber is pressed against the object to be pressed, the electric components are less likely to be misaligned even at the periphery of the pressing rubber because the pressing rubber is prevented from lateral extension by the dam member. As a result of the absence of lateral extension of the pressing rubber, nearly the total force for deforming the pressing rubber converts into a force for pressing the object to be pressed, thereby avoiding wasted pressure during pressing.

BRIEF DESCRIPTION OF THE DRAWINGS

FIGS. 8(a)-(c) are sectional diagrams for illustrating a process for packaging electric components on a substrate;

FIGS. 10(a)-(c) are sectional diagrams for illustrating a process for packaging electric components on a substrate using a compression bonding device according to a fourth embodiment;

FIGS. 13(a)-(c) are sectional diagrams for illustrating a process for packaging electric components on a substrate using a compression bonding device according to a fifth embodiment;

FIGS. 18(a) and (b) are sectional diagrams for illustrating a conventional packaging process; and FIG. 19 is a plan view for illustrating extension of a pressing rubber.

DETAILED DESCRIPTION OF THE EMBODIMENTS

Figure 1:
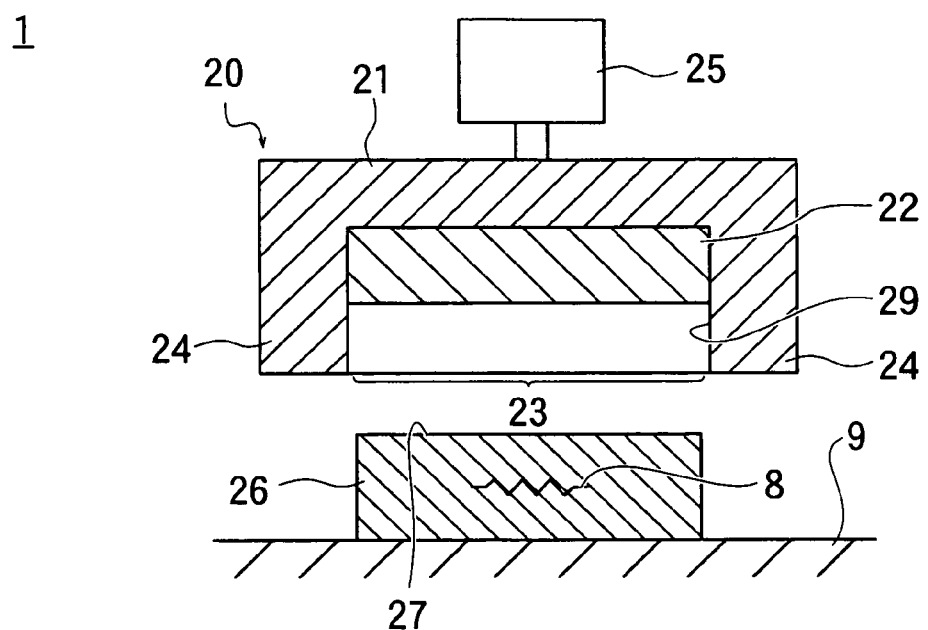
FIG. 1 is a sectional diagram for illustrating a compression bonding device according to a first embodiment.

Reference numeral 1 in FIG. 1 represents a first embodiment of a compression bonding device of the present invention. This compression bonding device 1 has a platform 9, a drive unit 25, a pressing head 20 and a pedestal 26. The pressing head 20 has a head body 21, a dam member 24 and a bonding part 22.

In this embodiment, the head body 21 is in the shape of a plate and is formed of metal such that head body 21 does not deform when head body 21 presses the object to be pressed 10, described later. The bonding part 22 is formed of an internally homogeneous elastic material (e.g., rubber); and, in contrast to metal materials such as iron, the bonding part 22 deforms when a force is applied thereto, and returns to the original shape when the force is removed.

The bonding part 22 is fixed on the surface of the head body 21. The pressing head 20 is placed above the platform 9 with the bonding part 22 facing downward.

The pressing head 20 is connected to the drive unit 25, so that when the drive unit 25 is activated, the pressing head 20 moves vertically upward and downward above the platform 9 with the exposed face of the bonding part 22 facing downward.

The head body 21 has a quadrangular shape in plan view, and the bonding part 22 is in the form of a quadratic prism. The size of the head body 21 is larger than that of the bonding part 22. A cylindrical dam member 24 is placed on the head body 21 externally extending over the bonding part 22 so as to surround the bonding part 22.

The dam member 24 is made from the same metal as that of the head body 21, and the dam member 24 is fixed to the head body 21. The edge of the dam member 24 projects from the surface of the bonding part 22, and a concave portion 29 is formed, which has the inside face of the dam member 24 as a side face and the surface of the bonding part 22 as a bottom face.

The inside face of the dam member 24 is nearly perpendicular to a horizontal plane, and the surface of the bonding part 22 is nearly horizontal. The height of the edge of the dam member 24 from the surface of the bonding part 22 is uniform. Thus, an opening 23 formed by the edges of the dam member 24 lies in a horizontal plane and has the same quadrangular shape as that of the bottom face of the concave portion 29. The pedestal 26 is in the form of a quadratic prism and is placed upright on the platform 9 with one base end surface being in close contact with the surface of the platform 9.

Figure 2:
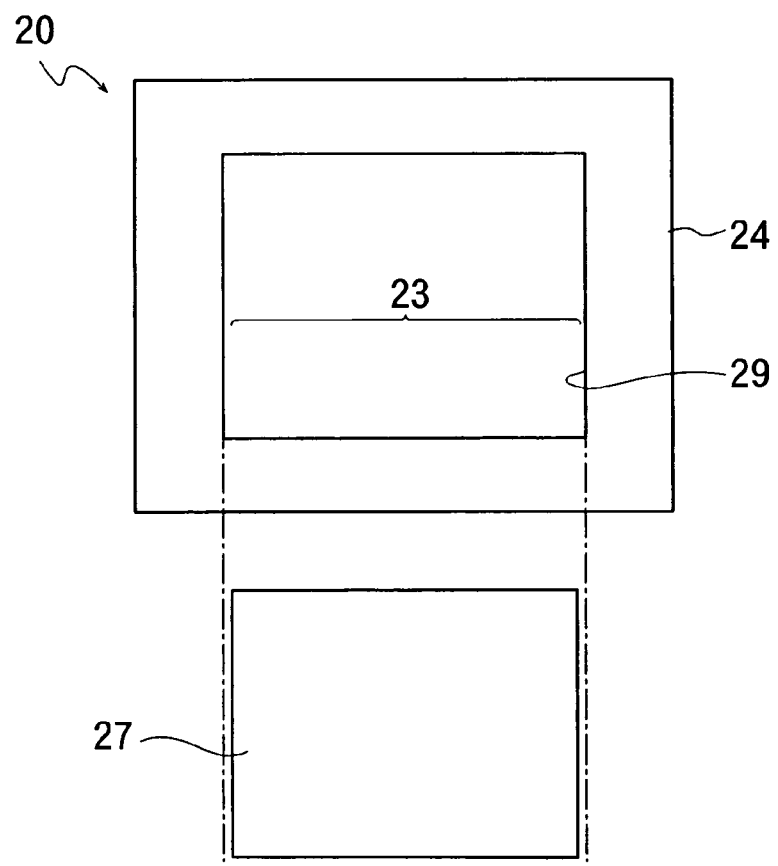
FIG. 2 is a plan view for illustrating the geometry of the pressing head and the pedestal.

The other base end surface of the pedestal 26 is a mounting face 27 on which the object to be pressed 10, described later, is to be mounted. The mounting face 27 is parallel with the surface of the platform 9, so that the mounting face 27 is nearly horizontal. The mounting face 27 has the same shape as that of the opening 23 of the concave portion 29 or a similar shape slightly smaller than the opening 23 of the concave portion 29 (FIG. 2) so that the part of the pedestal 26 on which the mounting face 27 lies can be inserted into the concave portion 29.

Figure 3:
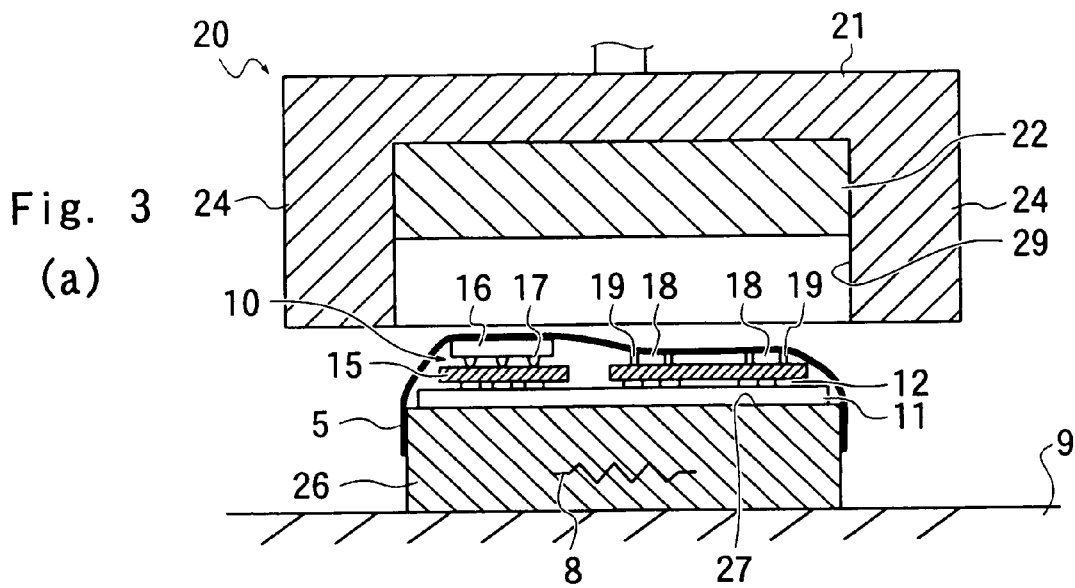
FIGS. 3(a)-(c) are sectional diagrams for illustrating a process for packaging electric components on a substrate.
Figure 3:
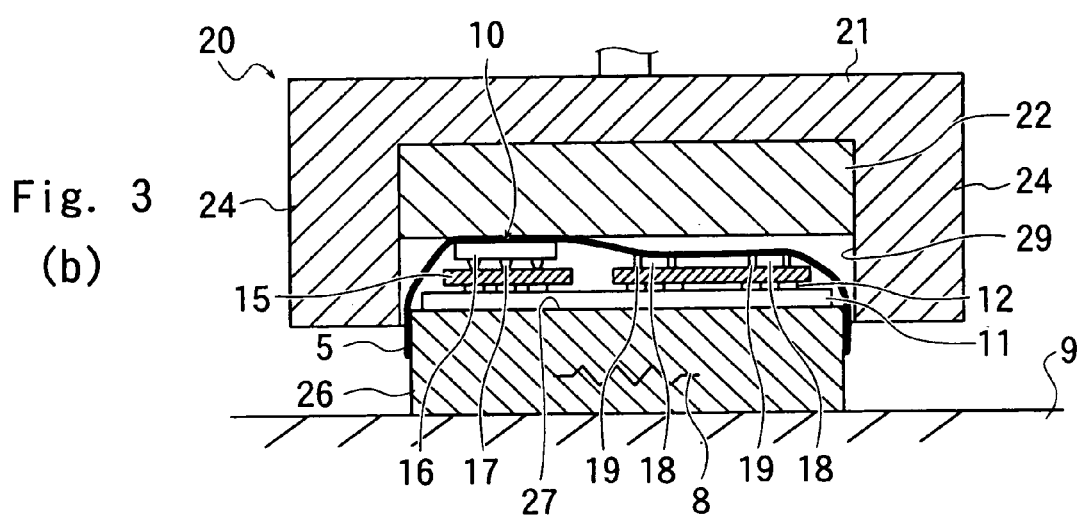
Figure 3:
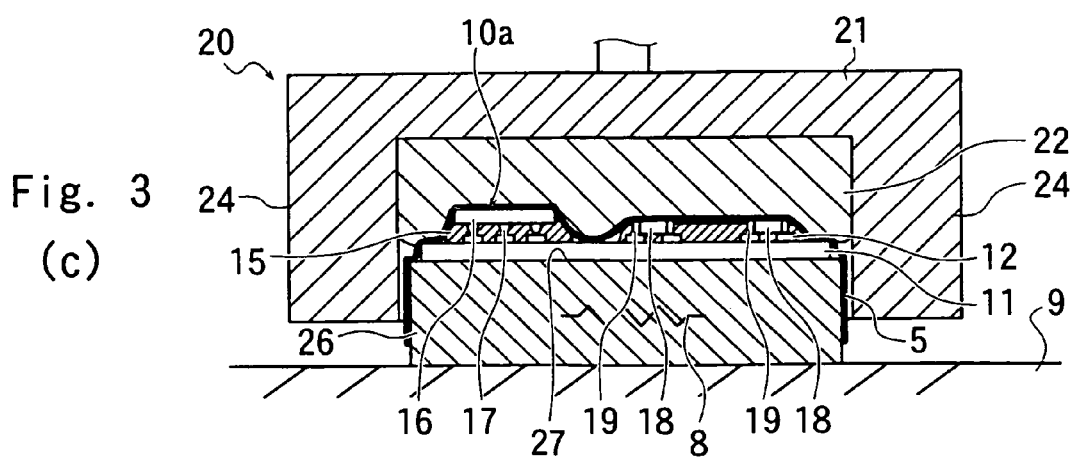

Next, a process for connecting electric components such as a semiconductor element to a substrate using this compression bonding device 1 is explained. Reference numeral 10 in FIG. 3(a) represents an object to be pressed. The object to be pressed 10 has a substrate 11, an anisotropic conductive film 15, and electric components 16, 18.

The anisotropic conductive film 15 is placed on terminals 12 of the substrate 11. The electric components 16, 18 are placed on the side of the anisotropic conductive film 15 opposite to the substrate 11. The electric components 16, 18 have terminals 17, 19 such as bumps or lands. The terminals 17, 19 of the electric components 16, 18 are placed above the terminals 12 of the substrate 11.

The electric components 16, 18 are individually mounted on the anisotropic conductive film 15 by a mounting head, not shown, and then pressed by a small pressure with the mounting head while they are preliminarily heated at a relatively low temperature. Electric components 16, 18 are tentatively bonded to the substrate 11 by an adhesive force developed by the anisotropic conductive film 15 (tentative compression bonding). However, the adhesive force during tentative bonding is so weak that the electric components 16, 18 readily fall off the substrate 11. The terminals 12 of the substrate 11 and the terminals 17, 19 of the electric components 16, 18 are in neither physical nor mechanical contact with each other, and the anisotropic conductive film 15 exists between them.

The surface of the substrate 11 on which the electric components 16, 18 are not placed is flat so that the object to be pressed 10 can be mounted on the pedestal 26 with the flat surface being in close contact with the mounting face 27.

The anisotropic conductive film 15 is larger than the electric components 16, 18 and partially extends over the electric components 16, 18 so that the anisotropic conductive film 15 is exposed between the electric components 16 and 18. Even if the anisotropic conductive film 15 is not exposed between the electric components 16, 18, the anisotropic conductive film 15 partially extends over the outer peripheries of the electric components 16, 18 when it is pressed during the pressing step, described later.

The bonding part 22 has a surface formed of a material that can be bonded to the anisotropic conductive film 15, and therefore, a protective film 5 having low adhesiveness to the anisotropic conductive film 15 is placed on the surface of the object to be pressed 10 so as to prevent the bonding part 22 and the anisotropic conductive film 15 from contacting each other during the pressing step, described later (FIG. 3(a)).

Here, the mounting face 27 is smaller than the opening 23 and the protective film 5 is larger than the mounting face 27 so that the outer periphery of the pedestal 26 including the protective film 5 hanging along the side face of the pedestal 26 at the edge approximately equals to the size of the opening 23.

Thus, when the pressing head 20 and the pedestal 26 are aligned so that the opening 23 conforms to the outer periphery of the pedestal 26 including the protective film 5, and when the pressing head 20 is lowered by the drive unit 25, the pedestal 26 is inserted into the concave portion 29 together with the protective film 5.

The protective film 5 is formed of a compressively deformable material. The pedestal 26 can be inserted into the concave portion 29 even if the outer shape of the pedestal 26, including the protective film 5, is slightly larger than the opening 23.

The electric components 16, 18 can be, for example, semiconductor elements or resistance components, and can have different thicknesses depending on the type of the component. The thickness difference between the electric components 16 and 18 forms a step on the surface of the substrate 11.

FIG. 3(b) shows a state in which the bonding part 22 is in contact with the thickest electric component 16 on the substrate 11 via the protective film 5 before the mounting face 27 of the pedestal 26 is inserted into the concave portion 29 together with the object to be pressed 10. The bonding part 22 presses the electric components 16, 18 of the object to be pressed 10. In this state, the mounting face 27 lies above the opening 23 and the edge portion of the side face of the pedestal 26 on the side of the mounting face 27 is inserted into the concave portion 29 and surrounded by the inside face of the dam member 24.

When the pressing head 20 is further lowered from this state and the bonding part 22 is brought relatively close to the substrate 11, the part of the bonding part 22 in contact with the electric component 16 is pressed and deformed.

The side face of the bonding part 22 is not fixed to the dam member 24, and the bonding part 22 is depressed in not only central but also peripheral regions. When the pressing head 20 is further lowered, and presses the electric components 16, 18, electric components 16, 18 are successively contacted with and pressed by the surface of the bonding part 22 in the order of thickness from the thicker electric component 16 to thinner electric component 18.

When the bonding part 22 is depressed upon contact with the electric components 16, 18, the other regions of the bonding part not contacting the electric components 16, 18 bulge by the rebound. However, the bonding part 22 does not bulge horizontally outward. Instead, the surface of the bonding part 22 that does not face the electric components 16, 18 bulges downward because the bonding part 22 is fixed to the head body 21 at the bottom face and surrounded by the dam member 24 at the side face. Thus, the surface of the bonding part 22 bulges downward at regions between the electric components 16, 18 and around the object to be pressed 10 (FIG. 3(c)).

As noted above, the anisotropic conductive film 15 may be exposed between the electric components 16 and 18 or the anisotropic conductive film 15 may partially extend over the outer peripheries of the electric components 16, 18 when the electric components 16, 18 are pressed. However, the bonding part 22 does not directly come into contact with the anisotropic conductive film 15 because the spaces between the electric components 16, 18 and the electric components 16, 18 themselves are covered with the protective film 5.

The clearance between the pedestal 26 and the dam member 24 is so small that the bonding part 22 does not flow out from the clearance even if the surface of it bulges downward around the object to be pressed 10. That is, the downward bulging regions of the bonding part 22 may be filled in the cavities between the electric components 16 and 18, but the bonding part 22 does not radially flow outward in contrast to conventional methods. Thus, no outward force is exerted on the electric components 16, 18 and the electric components 16, 18 are not misaligned.

The pedestal 26 has a heater 8. The object to be pressed 10 is heated at a predetermined temperature by applying a current to the heater 8. The flowability of the anisotropic conductive film 15 is increased by heating.

Thus, when the electric components 16, 18 are pressed, the anisotropic conductive film 15 is thrust aside by the electric components 16, 18, and the terminals 17, 19 of the electric components 16, 18 are pressed against the terminals 12 of the substrate 11 with electrically conductive particles in the anisotropic conductive film 15 therebetween. As a result, the electric components 16, 18 and the substrate 11 are electrically connected to each other.

If the anisotropic conductive film 15 contains a thermosetting resin, the anisotropic conductive film 15 can be cured by heating. If the anisotropic conductive film 15 contains a thermoplastic resin, the anisotropic conductive film 15 can become solidified when the temperature drops after completion of heating. Thus, the electric components 16, 18 also are mechanically connected to the substrate 11 via the cured or solidified anisotropic conductive film 15, thereby producing an electric device 10a in which the electric components 16, 18 have been mechanically and electrically connected to the substrate 11.

The electric device 10a has higher reliable connection because none of the electric components 16, 18 are misaligned when the electric components 16, 18 are pressed.

As described above, the bonding part 22 is not bonded to the anisotropic conductive film 15 because the bonding part 22 does not come into contact with the anisotropic conductive film 15 when it presses the electric components 16, 18. Therefore, once the pressing head 20 is raised, the surface of the bonding part 22 is easily separated from the electric device 10a, and the electric device 10a is left on the pedestal 26.

When the bonding part 22 is separated from the electric device 10a, the force applied to the bonding part 22 is removed and the bonding part 22 returns to the original shape that it had before the bonding part 22 pressed the electric components 16, 18.

If the electric device 10a left on the pedestal 26 is removed and a new object to be pressed 10 is mounted on the pedestal 26, electric components 16, 18 can be continuously connected by the process shown in FIG. 3(a)-(c) and described above.

The height of the edge of the dam member 24 is not specifically limited, but the amount by which the bonding part 22 bulges downward when it presses the object to be pressed 10 does not exceed the maximum thickness of the object to be pressed 10. Therefore, the bonding part 22 does not bulge out from under the dam member 24 if the height from the surface of the bonding part 22 to the edge of the dam member 24 before the bonding part 22 is pressed is equal to or greater than the total of the thickness of the thickest electric component 16 (e.g., semiconductor element) plus the thickness of the substrate 11.

The foregoing description relates to cases in which the concave portion 29 has been preliminarily formed in the pressing head 20, the object to be pressed 10 is inserted in the concave portion 29, and the bonding part 22 is then contacted with the object to be pressed 10. However, the present invention is not limited to such cases.

Figure 4:
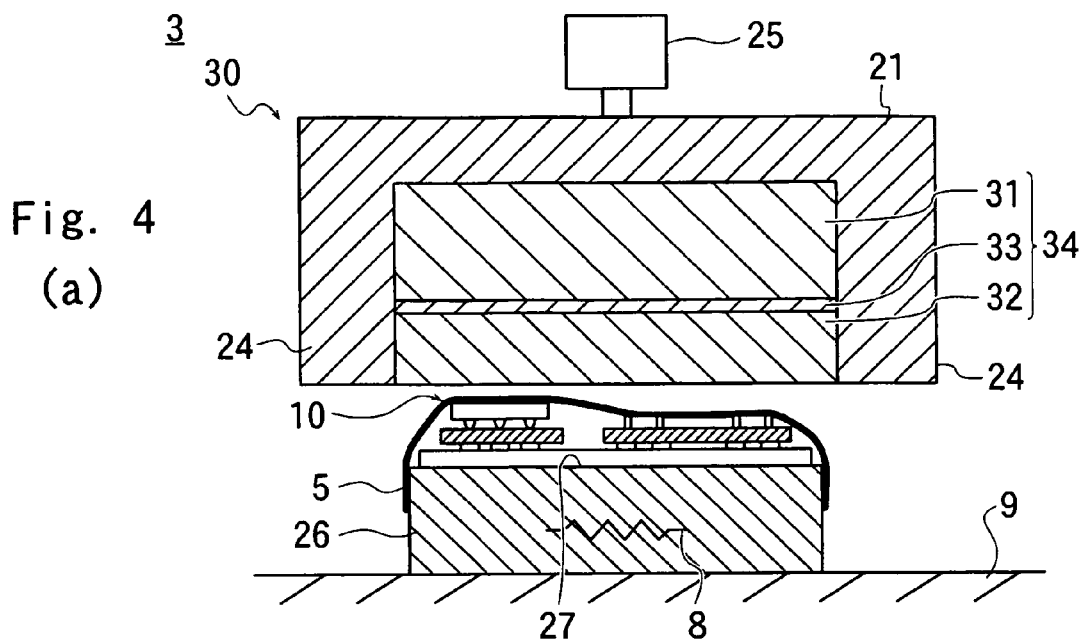
FIGS. 4(a)-(c) are sectional diagrams for illustrating a process for packaging electric components using a compression bonding device according to a second embodiment.
Figure 4:
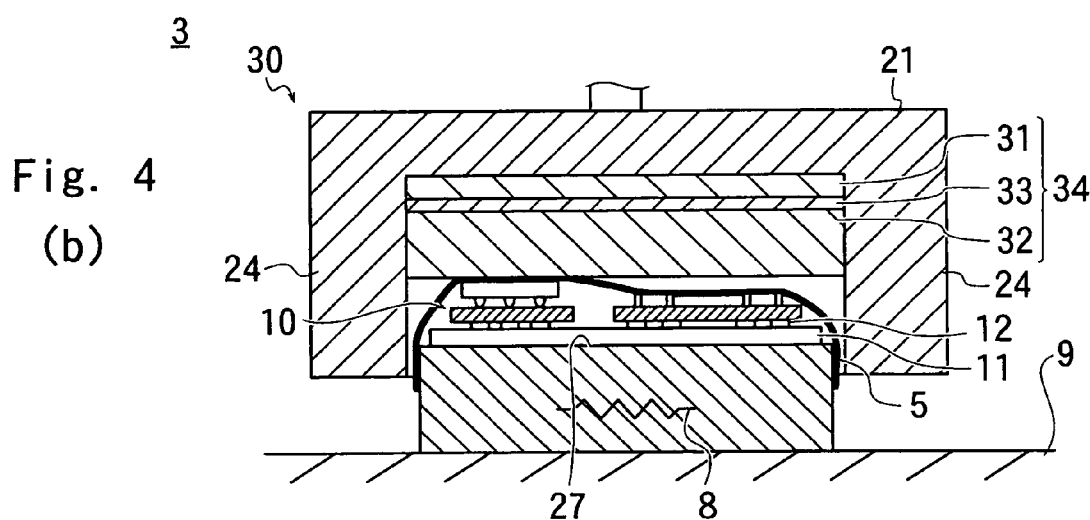
Figure 4:
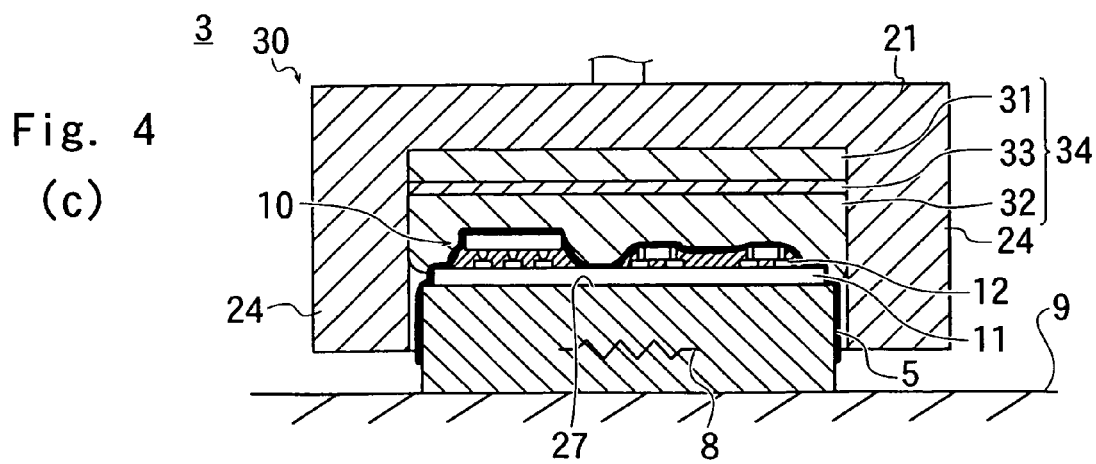

Reference numeral 3 in FIG. 4(a) represents a compression bonding device according to a second embodiment. The compression bonding device 3 has the same structure as that of the compression bonding device 1 according to the first embodiment. The layout of the pressing head 30 and the pedestal 26 also is the same as that of the compression bonding device 1 according to the first embodiment except that the bonding part 34 of the pressing head 30 is changed as follows.

In contrast to the bonding part 22 of the compression bonding device 1 according to the first embodiment, which is formed of rubber, the bonding part 34 of the compression bonding device 3 has a movable plate 33, a compression member 31, and a pressing rubber 32 formed of the same rubber as that of the bonding part 22 of the compression bonding device 1 according to the first embodiment. The compression member 31 is formed of a material having internal cavities that are collapsed under pressure to decrease the volume, such as sponge-like rubber.

The upper end of the compression member 31 is fixed to the surface of the head body 21, the surface of the movable plate 33 is fitted to the lower end of the compression member 31, and the upper end of the pressing rubber 32 is fitted to the back face of the movable plate 33. Thus, the compression member 31, movable plate 33 and pressing rubber 32 are arranged in the order as described from the head body 21 toward a downward vertical direction where the pedestal 26 lies.

The compression member 31 has the same columnar shape in horizontal section as the sectional shape of a region surrounded by the dam member 24. Thus, the side face of the compression member 31 is in contact with the inside face of the dam member 24, but is not fixed to the dam member 24. The pressing rubber 32 and movable plate 33 also are unfixed to the dam member 24, and are movable within the region surrounded by the dam member 24.

FIG. 4(b) shows a state in which the pressing head 30 is further lowered after the pressing rubber 32 has been contacted with the protective film 5 on the object to be pressed 10.

The force required to deform the compression member 31 is smaller than the force required to deform the pressing rubber 32. When the pressing head 30 is lowered, the compression member 31 is pressed against the head body 21 by the pressing rubber 32 and the compression member 31 is compressed and reduced in thickness before the pressing rubber 32 deforms. The compression member 31 is pressed by the pressing rubber 32, whereby a concave portion, which does not exist before compression member 31 is compressed by the pressing head 30, is formed.

The compression of the compression member 31 stops when the compressing member 31 deforms to some extent due to the limitation of the amount by which the compression member 31 can deform. If the pressing head 30 is lowered further, the pressing rubber 32 deforms (FIG. 4(c)).

When the pressing rubber 32 deforms, the concave portion described above is formed, and the edge of the dam member 24 projects below the surface of the pressing rubber 32. A clearance between the edge and the pedestal 26 is small. Thus, the pressing rubber 32 does not flow out from the clearance and the electric components 16, 18 are not misaligned in the same manner as with the compression bonding device 1 according to the first example.

Figure 5:
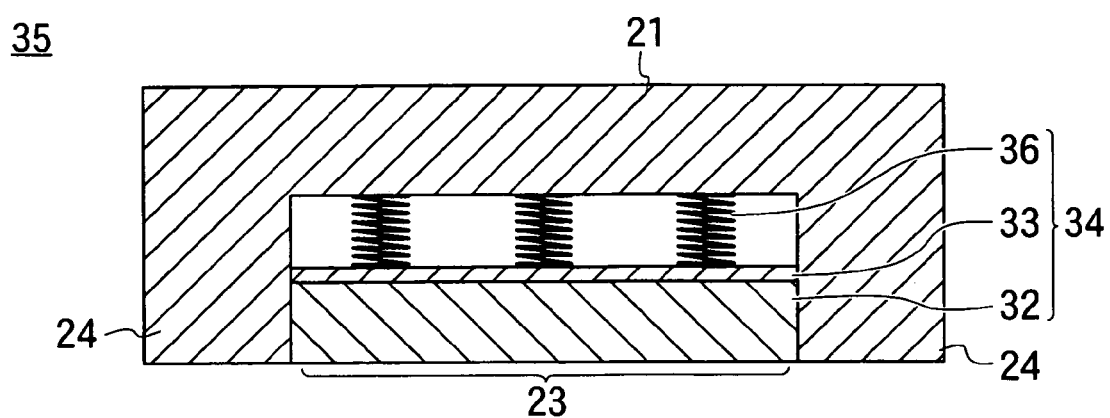
FIG. 5 is a sectional diagram for illustrating another embodiment of the pressing head.

The configuration of the compression member 31 is not specifically limited so long as the configuration of the compression member 31 allows the compression member 31 to decrease in volume by pressing. The pressing head represented by reference numeral 35 in FIG. 5 has the same structure as that of the pressing head 3 shown in FIG. 4(a)-(c) except that the compression member differs, as discussed below. The same members in pressing head 35 are explained with the same reference numbers of pressing head 3.

The compression member of this pressing head 35 is comprised of a spring 36. The spring 36 may be compressed by pressing to raise the surface of bonding part 34, whereby the edge of the dam member 24 may project below the bonding part 34.

If the force applied to the pressing rubber 32 can be transferred to the compression member 36, there is no special need for providing the supporting plate 33.

The foregoing description relates to cases in which a dam member is provided on the pressing head 20, but the present invention is not limited to such cases.

Figure 6:
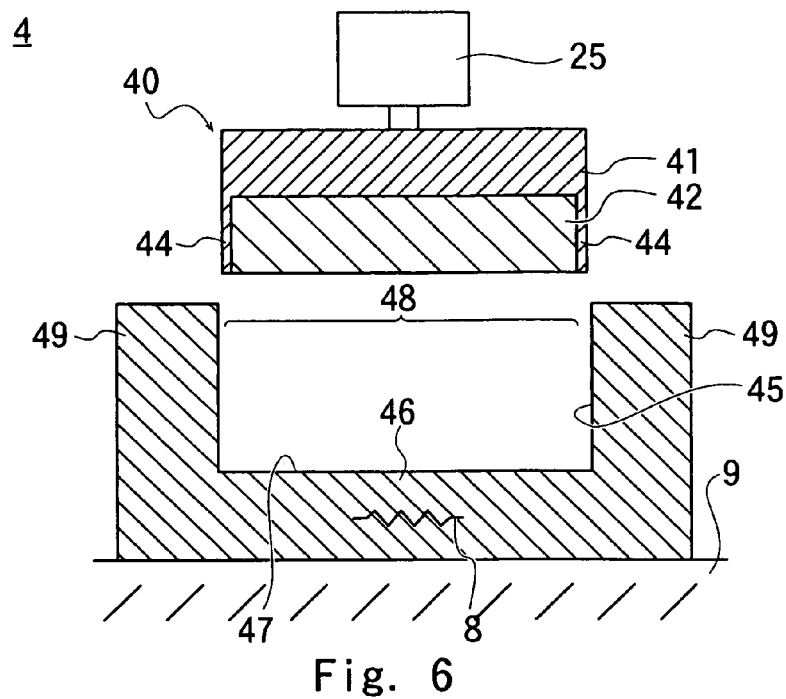
FIG. 6 is a sectional diagram for illustrating a compression bonding device according to a third embodiment.

Reference numeral 4 in FIG. 6 represents a compression bonding device according to a third embodiment. Compression bonding device 4 has the same structure as that of the compression bonding device 1 according to the first embodiment, except that a dam member is not provided on the pressing head 40. The dam member 49 is provided around the mounting face of the pedestal 46, as discussed below.

Here, the bonding part 42 has a pressing rubber that is fitted to the surface of the head body 41 in the same manner as in the compression bonding device 1 according to the first embodiment. However, the bonding part 42 is surrounded by a sliding plate 44 formed of a thin plate instead of a dam member.

The pedestal 46 is columnar in the same manner as in the compression bonding device 1 according to the first embodiment The dam member 49 is fixed to the pedestal 46 around the mounting face 47 so as to surround the mounting face 47.

The edge of the dam member 49 projects above the mounting face 47 to form a concave portion 45 having the inside face of the dam member 49 as a side face, and the mounting face 47 as a bottom face.

Figure 7:
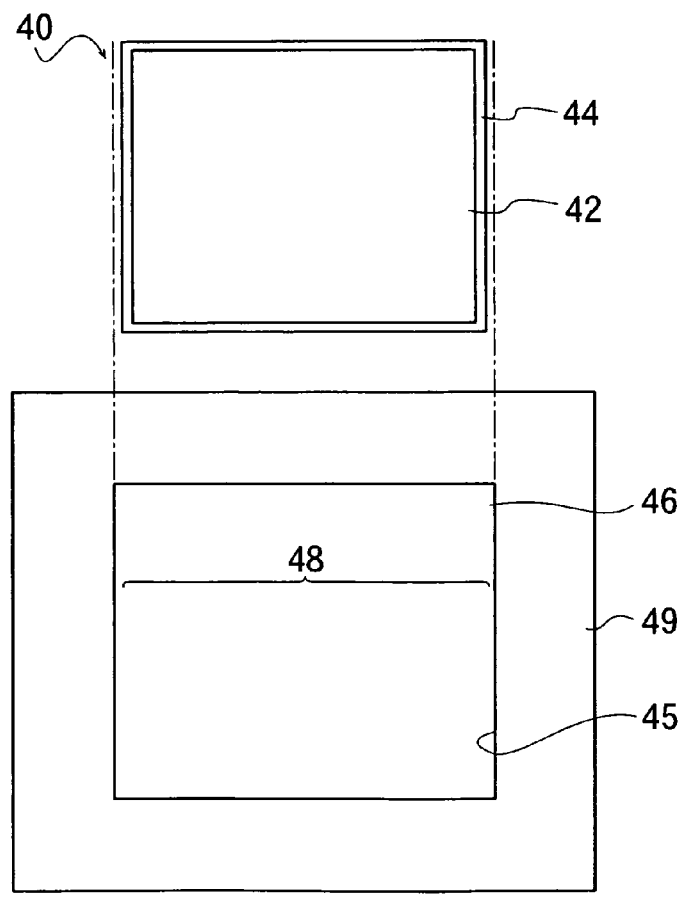
FIG. 7 is a plan view for illustrating the geometry of the pressing head and the pedestal.

FIG. 7 is a schematic plan view for comparing the planar shape of the pedestal 46 and the planar shape of the pressing head 40. The outer periphery including the sliding plate 44 of the bonding part 42 is equal to or smaller than the opening 48 of the concave portion 45.

The side face of the bonding part 42 is directed vertically downward and the side face of the sliding plate 44 is also directed vertically downward because the thickness of the sliding plate 44 is uniform. The inside face of the dam member 49 is directed vertically downward, whereby the lower end of the pressing head 40 can be inserted into the concave portion 45.

Next, a process for connecting the object to be pressed 10 described above by using this compression bonding device 4 is explained. In the same manner as with the compression bonding device 1 according to the first embodiment, the object to be pressed 10 is placed on the mounting face 47. The protective film 5 is placed on the opening 48 of the dam member 49, the protective film 5 is pushed into the dam member 49, and the object to be pressed 10 is covered with the protective film 5 (FIG. 8(a)).

The opening 48 of the concave portion 45 is larger than the outer periphery of the planar shape of the pressing head 40. The protective film 5 is large enough to cover the side face and the periphery of the concave portion 45 by its edge so that the size of the opening 48 of the concave portion 45 narrowed by covering opening 48 with the protective film 5 approximately equals the size of the outer periphery of the planar shape of the pressing head 40.

Thus, when the pressing head 40 and the pedestal 46 are aligned so as to conform the opening 48 to the outer periphery of the pressing head 40, and the pressing head 40 is lowered by the drive unit 25, the lower end of the pressing head 40 is inserted into the opening 48 and surrounded by the dam member 49.

FIG. 8(b) shows a state in which the lower end of the pressing head 40 is inserted into the opening 48 and the surface of the bonding part 42 is in contact with the thickest electric component 16 via the protective film 5. In this state, the bonding part 42 is not pressed and not deformed.

In this state, the side face of the bonding part 42 is surrounded by the dam member 49 from the surface of bonding part 42 to the bottom face if the sliding plate 44 is flexible, or at least the periphery of the surface of the bonding part 42 is surrounded by the dam member 49 if the sliding plate 44 is not flexible.

Thus, the side face of the bonding part 42 is surrounded by a rigid member in either case. When the pressing head 40 is lowered and presses the bonding part 42 against the object to be pressed 10, the bonding part 42 does not bulge horizontally outward. Instead, its surface bulges downward (FIG. 8(c)).

The distance from the edge of the surface of the bonding part 42 to the dam member 49 is short because the sliding plate 44 is thin and the clearance between the pressing head 40 and the dam member 49 also is mall. Even if the bonding part 42 is raised and extends outward, the bonding part 42 is stopped by the dam member 49 and therefore, the amount of extension is small and the electric components 16, 18 are less likely to be misaligned.

If there is a great difference between the size of the planar shape of the pressing head 40 and the size of the opening 48 of the dam member 49, the clearance between the dam member 49 and the side face of the pressing head 40 may be filled with the protective film 5 by designing the protective film 5 as thick as possible.

Figure 9:
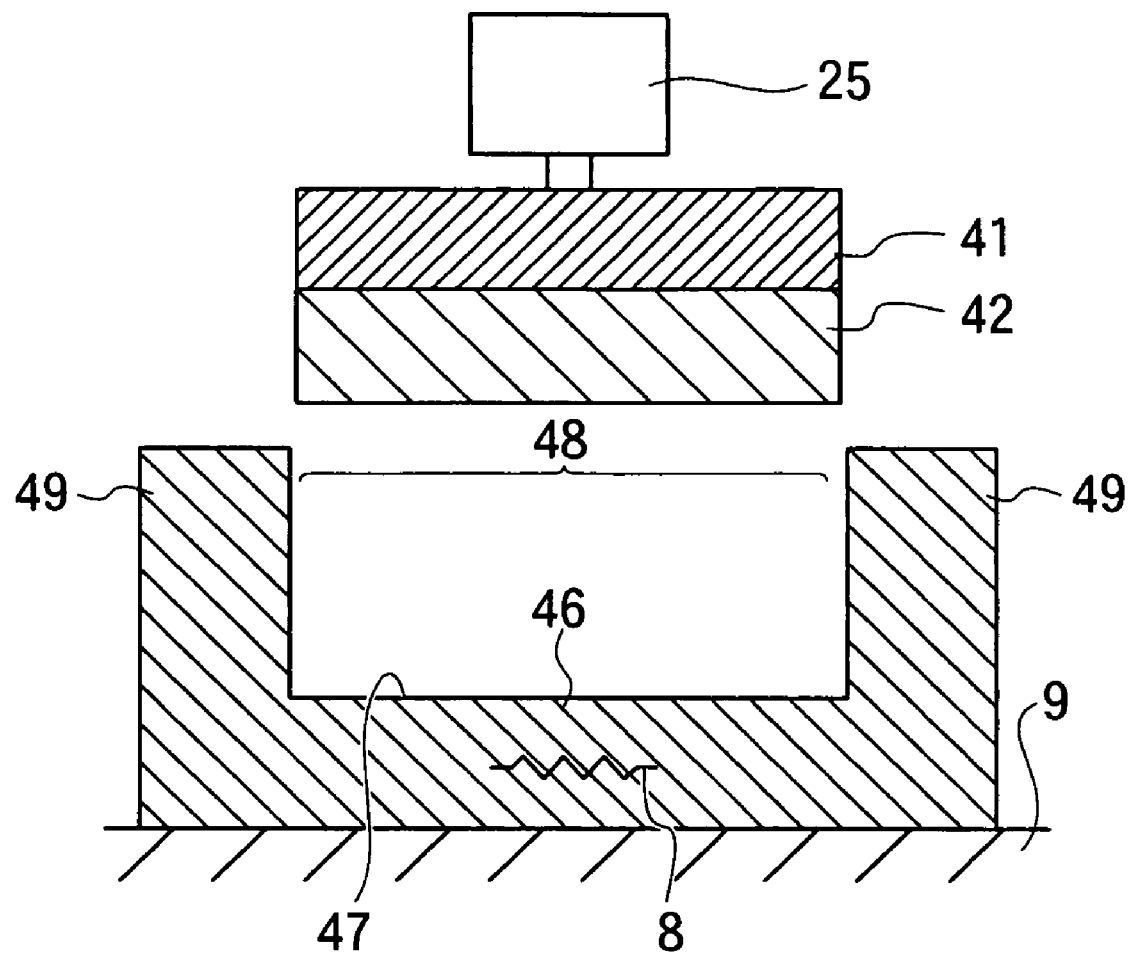
FIG. 9 is a sectional diagram for illustrating another embodiment of the pressing head.

The foregoing description relates to cases in which the bonding part 42 is surrounded by the sliding plate 44, but the present invention is not limited to such cases. For example, the side face of the bonding part 42 may be exposed without providing the sliding plate 44 around it, as shown in FIG. 9.

The foregoing description relates to cases in which the dam member is fixed to the head body 41 or pedestal 46, but the present invention is not limited to such cases, and the dam member may be formed of a member that is separate from the pedestal or the head body, and the dam member may be in close contact with the pedestal or the head body when the object to be pressed 10 is pressed.

Reference numeral 7 in FIG. 10(a) represents a compression bonding device according to a fourth embodiment. The compression bonding device 7 has the same structure as that of the compression bonding device 1 according to the first embodiment, and the layout of the pressing head 70 and the pedestal 26 also is similar except that the dam member 74 of the pressing head 70 is formed of a member that is separate from the head body 71. FIG. 10(a) shows that a state in which the dam member 74 is separated from the head body 71.

Figure 11:
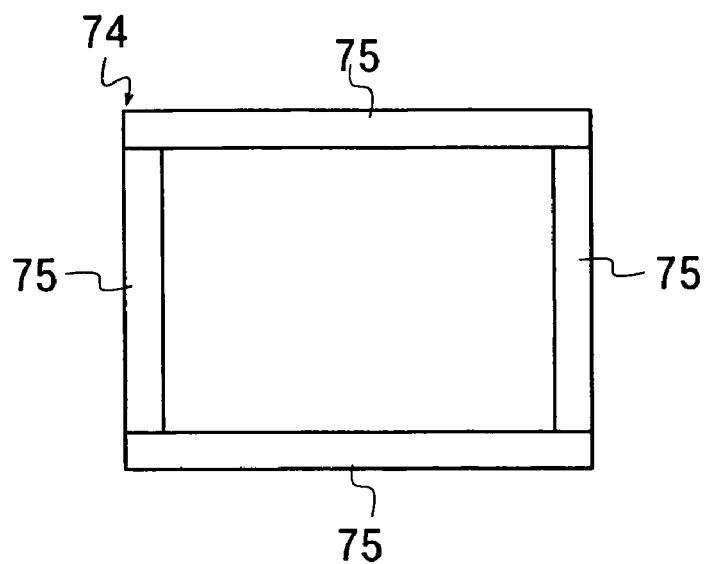
FIG. 11 is a plan view for illustrating an embodiment of a dam member.

The dam member 74 has a plurality of plate-shaped unit members 75, as shown in FIG. 11. The unit members 75 arranged along the side face of the bonding part 72 have their surfaces oriented to be in close contact with the head body 71 by a moving means, not shown. In the state where each unit member 75 is in close contact with the head body 71, the side face of the bonding part 72 is surrounded by the unit members 75.

FIG. 10(b) shows a state in which the bonding part 72 is in contact with the protective film 5 on the thickest electric component 16, and the bonding part 72 is not pressed and not deformed. The unit members 75 should be brought into close contact with the head body in this state. The side face of the bonding part 72 may be surrounded by the unit members 75 when the bonding part 72 is pressed and deformed.

When the bonding part 72 is a pressing rubber, each unit member 75 should be fitted to project at the lower end from the surface of the bonding part 72 before the bonding part 72 is pressed so that the bonding part 72 may not bulge out from under the dam member 74 even if the pressing head 70 is further lowered to press the bonding part 72 in the same manner as with the compression bonding device 1 according to the first embodiment, so that the electric components 16, 18 are not misaligned (FIG. 10(c)).

The bonding part 72 may also be formed of a pressing rubber and a compression member.

Figure 16:
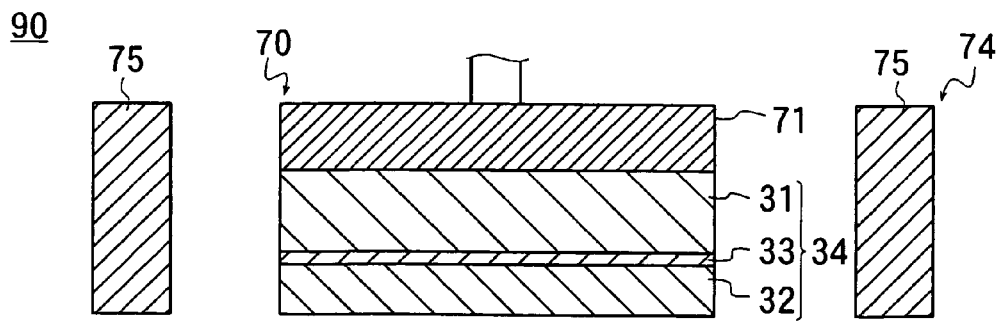
FIG. 16 is a sectional diagram for illustrating another embodiment of a pressing head having a separable dam member.
Figure 17:
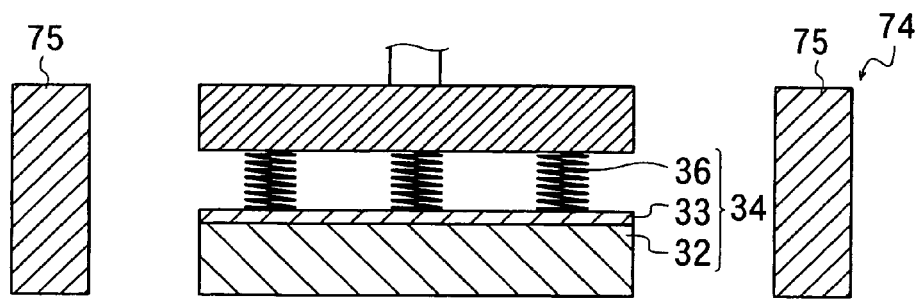
FIG. 17 is a sectional diagram for illustrating another embodiment of a pressing head having a separable dam member.

Reference numerals 90 and 95 in FIGS. 16 and 17 represent pressing heads in which a dam member 74 can be separated from a head body 71 and a bonding part 72 has compression members 31, 36 and a pressing rubber 32. The pressing head 90 in FIG. 16 has the same structure as that of the bonding part 34 of the pressing head 30 in FIG. 4(a)-(c), and the pressing head 95 in FIG. 17 has the same structure as that of the bonding part 34 of the pressing head 35 in FIG. 5. Moreover, the layout of the head body 71 and the unit member 75 is similar to that of the pressing head 70 in FIG. 10 and will be explained with the same reference numerals for the same members.

The pressing heads 90, 95 can also be designed in such a manner that, when the dam member 74 is fitted to the head body 71, the edge of the dam member 74 may be flush with the surface of the bonding part 34 before the bonding part 34 is pressed. Alternatively, the surface of the bonding part 34, before the bonding part 34 is pressed, may project below the edge of the dam member 74, or the edge of the dam member 74 may project below the surface of the bonding part 34 before the bonding part 34 is pressed so long as a concave portion having the surface of the pressing rubber 32 as a bottom face is subsequently formed by compression of the compression member 31.

Figure 12:
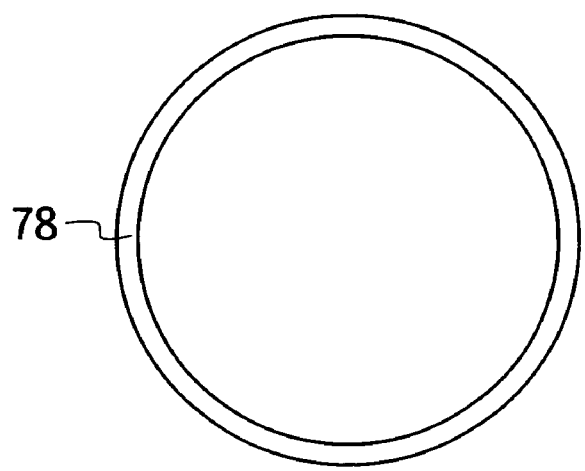
FIG. 12 is a plan view for illustrating another embodiment of a dam member.

The foregoing description relates to cases in which the dam member 74 is formed of a plurality of unit members 75, but the present invention is not limited to such cases. For example, the dam member 78 may be initially cylindrically shaped as shown in FIG. 12. In this case, the pressing head 70 is inserted into the cylinder of the dam member 78 and the bonding part 72 is surrounded by the inner periphery surface of the dam member 78 before the object to be pressed 10 is pressed and the bonding part 72 is deformed. In this case, misalignment of the electric components 16, 18 can be prevented because lateral extension of the bonding part 72 is stopped by the dam member 78.

Next, cases in which the dam member can be separated from the pedestal are explained.

Reference numeral 8 in FIG. 13(a) represents a compression bonding device according to a fifth embodiment of the present invention. The compression bonding device 8 has the same structure as that of the compression bonding device 4 according to the third embodiment described above. The layout of the pedestal 86 and the pressing head 40 also is similar except that the dam member 89 is another member that can be separated from the pedestal 86. FIG. 13(a) shows a state in which the dam member 89 is separated from the pedestal 86.

The dam member 89 may be formed of a plurality of unit members as shown in FIG. 11 or may be formed of a single cylinder as shown in FIG. 12. When the dam member 89 is formed of a plurality of unit members, each unit member is arranged along the edge of the mounting face 87 and is in close contact with the mounting face 87 so as to surround the mounting face 87. When the dam member 89 is cylindrical, the pedestal 86 is inserted into the lower end of the cylinder, thereby bringing the dam member 89 into close contact with the pedestal 86.

In the state where the dam member 89 is in close contact with the pedestal 86, the edge of the dam member 89 projects above the mounting face 87, whereby a concave portion 85 is formed, which has the inner peripheral surface of the dam member 89 as a side face and the mounting face 87 as a bottom face.

The magnitude relation between the opening of the concave portion 85 and the pressing head 40 is similar to that of the compression bonding device 4 shown in FIGS. 6 and 7 so that the lower end of the pressing head 40 can be inserted into the concave portion 85.

FIG. 13(b) shows a state in which the bonding part 42 is in contact with the thickest electric component 16 of the object to be pressed 10 on the mounting face 87 via the protective film 5. In this state, the bonding part 42 is not pressed and not deformed. At this state, the dam member 89 should be brought into close contact with the pedestal 86, to thereby surround the mounting face 87 by the dam member 89.

In the compression bonding device 8, horizontal extension of the bonding part 42 also becomes small and prevents misalignment of the electric components 16, 18 because the raised surface of the bonding part 42 is stopped by the dam member 89 (FIG. 13(c)).

If the planar shape of the protective film 5 is so large that it extends over the mounting face 87, the protective film 5 is not entangled between the dam member 89 and the pedestal 86 by fitting the dam member 89 to the pedestal 86 and then applying the protective film 5 thereon.

Figure 14:
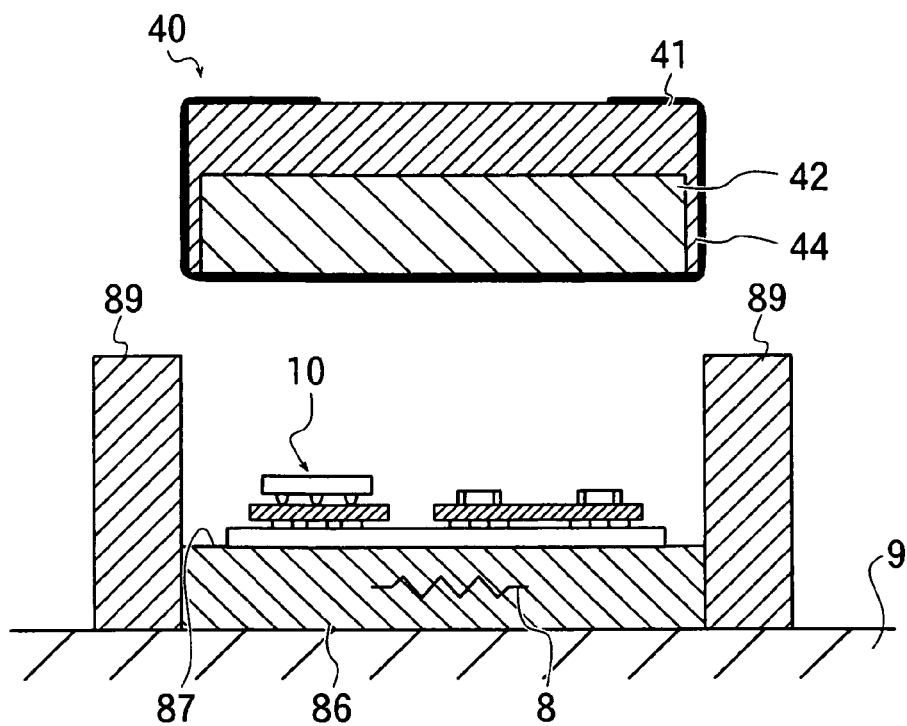
FIG. 14 is a sectional diagram for illustrating another embodiment of a method for placing a protective film.

As shown in FIG. 14, the protective film 5 may be wound around the pressing head 40 rather than being applied on the mounting face 87. Further, the pressing head 40 may be pressed against the object to be pressed 10 while the surface of the bonding part 42 is covered.

Figure 15:
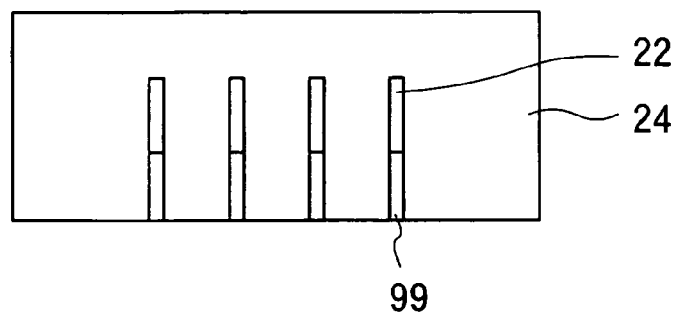
FIG. 15 is a side view for illustrating another embodiment of a dam member.

The foregoing description relates to cases in which the bonding part 22 is entirely surrounded by the dam member 24 of the pressing head 20 or the dam member 49 when the object to be pressed 10 is pressed, but the present invention is not limited to such cases. For example, one or more slits 99 may be formed in the dam member 24, and the side face of the bonding part 22 may be partially exposed, as shown in FIG. 15, so that horizontal extension of the bonding part 22 can be prevented when the object to be pressed 10 is pressed.

The shape and size of the protective film 5 are not specifically limited. A protective film 5 having a size that does not extend over the mounting faces 27, 47, 87 may be used, or a protective film 5 covering only a partial surface of the object to be pressed 10 may be used, as long as any contact can be avoided between the anisotropic conductive film 15 and the bonding parts 22, 34, 42, 72.

If the adhesiveness between the anisotropic conductive film 15 and the bonding parts 22, 34, 42, 72 is low, the bonding parts 22, 34, 42, 72 may be brought into direct contact with the object to be pressed 10 without using the protective film 5. As a method for decreasing the adhesiveness between the bonding parts 22, 34, 42, 72 and the anisotropic conductive film 15, the material from which the pressing rubber is formed may be changed to one having low adhesiveness to the anisotropic conductive film 15, or a release layer having releasability against the anisotropic conductive film 15 may be provided on the surface of the pressing rubber.

In this manner, the compression bonding devices of the present application can connect electric components to a substrate without using a protective film 5. However, if there is a large clearance between the dam member and the pressing head or between the dam member and the pedestal, the clearance can be decreased by covering the side face of the dam member with a protective film 5.

Thus, the pedestal, dam member and pressing head can be manufactured at low costs without using a mold or the like, and even if the molding precision is low, the clearance between the dam member and the pressing head or between the dam member and the pedestal can be filled by appropriately selecting the thickness of the protective film 5.

The type of the substrate 11 used in the present invention is not specifically limited, and various substrates such as rigid substrates and flexible substrate can be used.

The type of the electric component to be connected to the substrate 11 is not specifically limited. Furthermore, the compression bonding devices and connecting processes of the present application can be used to connect not only electric components but also another substrate onto the substrate 11.

The anisotropic conductive film 15 may contain either one or both of a thermoplastic resin and a thermosetting resin.

The types of the thermosetting resin and thermoplastic resin are not specifically limited. For instance, one or more thermosetting resins such as epoxy resins, acrylic resins and urethane resins can be used, and one or more thermoplastic resins such as phenoxy resins and polyvinyl alcohols can be used.

The type of conductive particles is not specifically limited. For instance, not only metal particles but also resin particles coated with a metal layer can be used.

Instead of using the anisotropic conductive film 15, a pasty anisotropic conductive adhesive may be applied on the surface of the substrate 11 and electric components may be bonded to the anisotropic conductive adhesive, thereby obtaining an object to be pressed 10.

The type of the protective film is not specifically limited, but preferably has releasability against the anisotropic conductive film 15 described above, e.g., a molded film of polytetrafluoroethylene or a molded film of silicone rubber.

The elastic material forming the pressing rubber is not specifically limited, and elastomers having rubber hardnesses (according to JIS S 6050) of 40, 80 could be used by way of example.

Rubber hardness is determined by the method described in "6. Test method" in JIS S 6050:2002, as follows.

Samples having stood for 24 hours or more after production are used for the test. General matters common to chemical analyses are as shown in JIS K 0050. A hardness tester is used in a test for hardness. The surface of a test sample piece horizontally held is brought into contact with the pressurizing face while the intender point of the tester is vertical. Then, the scale is immediately read as a positive number. As to the measurement point of the test sample piece, the entire surface of the test sample piece is divided into three, each center portion is measured individually, and then their median values become hardness of the test sample piece.

The hardness tester here refers to a spring hardness tester having a semi-circular indenter point of 5.08 mm±0.02 mm in diameter. The height of the indenter point is 2.54±0.22 mm at scale 0, and 0 mm at scale 100. The relationship between scale and spring force is shown in Table 1 below.

TABLE 1

Relationship between scale and spring force

| Scale | 0 | 10 | 20 | 25 | 30 | 40 | 50 | 60 | 70 | 75 | 80 | 90 | 100 |
|---|---|---|---|---|---|---|---|---|---|---|---|---|---|
| Spring Force N | 0.54 | 1.32 | 2.11 | 2.50 | 2.89 | 3.68 | 4.46 | 5.25 | 6.03 | 6.42 | 6.82 | 7.60 | 8.39 |

When elastomers having rubber hardnesses of 40, 60, 80 were measured for rubber hardness every 30° C. in a range of the measurement temperature of 30° C. to 240° C., the rubber hardness varied within ±2. It can be said that the rubber hardness is not influenced by temperature changes, because this value is within measurement error.

Elastomers used for the pressing rubber may include both natural and synthetic rubbers, and preferably silicone rubber in terms of heat resistance and pressure resistance.

The foregoing description relates to cases in which the pressing head 20 is moved upward and downward by the driving unit 25, but the present invention is not limited to such cases. For example, the platform 9 may be vertically moved upward and downward while the pressing head 20 is fixed, or both of the pressing head 20 and the platform 9 may be vertically moved upward and downward so far as the pressing head 20 and the platform 9 are relatively moved.

EMBODIMENTS

A semiconductor element 16 and a substrate 11 were connected by using the compression bonding device 1 according to the first embodiment with varying heights from the surface of the bonding part 22 to the edge of the dam member 24 before the bonding part 22 is pressed (edge height). The amount of horizontal displacement of the semiconductor element 16 was measured.

Here, the distance (clearance) from the side face of the pressing head 20 to the inner wall face of the dam member 24 was 50 μm when the pressing head 20 was inserted into the concave portion 29. By using a protective film 5 having a thickness of 50 μm, a pressure was applied with substantially no clearance between the pressing head 20 and the dam member 24. The thickness of the semiconductor element 16 was 0.4 mm, and the thickness of the substrate 11 was 0.6 mm.

The maximum amount of displacement of the semiconductor element 16 measured is shown in Table 2 below along with the edge height of the dam member 24.

TABLE 2

| Edge height of a dam member and maximum amount of displacement | |
|---|---|
| Edge heigh (mm) | Maximum amount of displacement (mm) |
| −3.0 | 0.050 |
| −1.0 | 0.050 |
| 0 | 0.050 |
| 1.0 | 0.020 |
| 2.0 | 0.015 |
| 3.0 | 0.015 |

In the column "edge height" in Table 2 above, "0 mm" means that the edge of the dam member 24 is flush with the surface of the bonding part 22, "+" means that the edge of the dam member 24 projects below the surface of the bonding part 22, and "−" means that the surface of the bonding part 22 projects below the edge of the dam member 24.

As shown in Table 2 above, the maximum amount of displacement becomes small when the edge of the dam member 24 projects from the surface of the bonding part 22 before the bonding part 22 is pressed, while the amount of displacement of the semiconductor element 16 is large when the surface of the bonding part 22 is flush with the edge of the dam member 24 or projects from the edge of the dam member 24.

The above test confirmed that displacement of electric components is prevented and highly reliable electric devices can be fabricated by providing the dam member 24 in such a manner that its edge projects from the surface of the bonding part 22.

What is claimed is:

1. A component packaging process comprising the steps of:
   placing, on a mounting face of a pedestal, an object to be pressed on which a plurality of components having different heights is placed on a substrate;
   moving a pressing head which provides a pressing rubber in a head body and the pedestal relatively to one another;
   placing a deformable protective film between the pressing rubber and the object to be pressed; and
   pressing the components with the pressing rubber provided on the pressing head, thereby fixing the components to the substrate, wherein the pressing includes pressing the pressing rubber toward the object to be pressed via the protective film in a state that the object to be pressed is surrounded by a dam member and lateral flow of the pressing rubber due to deformation of the pressing rubber is stopped by the dam member, while heating the object to be pressed, thereby fixing the components to the substrate.

2. The component packaging process according to claim 1, further comprising:
   placing, on the substrate, the components which interpose an anisotropic conductive film,
   wherein the protective film is separable from the anisotropic conductive film, and when pressing the pressing rubber toward the object to be pressed via the protective film, the protective film is in contact with the anisotropic conductive film, thereby fixing the components to the substrate.

3. The component packaging process according to claim 2, wherein a compression member of which volume decreases under pressure is placed between the pressing rubber and the pressing head, and the dam member extends beyond a surface level of the pressing rubber, at least when the compression member is compressed by applying a pressure.

4. The component packaging process according to claim 1, further comprising:
   inserting the pedestal into a space surrounded by the dam member; and
   pressing the object to be pressed with the pressing head.

5. The component packaging process according to claim 1, wherein the pressing rubber is surrounded by a movable plate, the pedestal is surrounded by the dam member, the pressing head is inserted into the space surrounded by the dam member, and the object to be pressed is pressed with the pressing head.

6. The component packaging process according to claim 1, wherein the dam member is separable from the head body.

* * * * *